United States Patent
Kim et al.

(10) Patent No.: US 11,228,317 B1
(45) Date of Patent: Jan. 18, 2022

(54) DUAL-DOMAIN SUB-SAMPLING PHASE-LOCKED LOOP

(71) Applicant: Korea University Research and Business Foundation, Seoul (KR)

(72) Inventors: Chul Woo Kim, Seoul (KR); Yoon Jae Choi, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/167,368

(22) Filed: Feb. 4, 2021

(30) Foreign Application Priority Data

Jul. 17, 2020 (KR) ........................ 10-2020-0089201

(51) Int. Cl.
*H03L 7/085* (2006.01)
*H03L 7/099* (2006.01)

(52) U.S. Cl.
CPC .............. *H03L 7/085* (2013.01); *H03L 7/099* (2013.01)

(58) Field of Classification Search
CPC ............ H03L 7/06; H03L 7/085; H03L 7/099
USPC ................... 327/147–149, 156–158
See application file for complete search history.

(56) References Cited

U.S. PATENT DOCUMENTS

| | | | | |
|---|---|---|---|---|
| 6,463,112 B1* | 10/2002 | Hafez | ...................... | H03L 7/185 327/157 |
| 7,737,743 B1* | 6/2010 | Gao | ......................... | H03L 7/087 327/158 |
| 8,299,826 B2* | 10/2012 | Perrott | ..................... | H03L 7/183 327/156 |
| 8,373,481 B2* | 2/2013 | Gao | ........................ | H03L 7/07 327/159 |
| 8,395,427 B1* | 3/2013 | Gao | ........................ | H03L 7/091 327/156 |
| 9,564,908 B2* | 2/2017 | Song | ..................... | H03L 7/0814 |
| 10,879,914 B1* | 12/2020 | Jung | ..................... | H03L 7/087 |
| 2006/0171495 A1 | 8/2006 | Youssouflan | | |
| 2008/0218226 A1* | 9/2008 | Nagaraj | ................. | H03L 7/089 327/147 |
| 2009/0207961 A1* | 8/2009 | Sai | ........................ | H03L 7/087 375/375 |
| 2009/0256601 A1* | 10/2009 | Zhang | .................... | H03L 7/089 327/156 |
| 2012/0242384 A1* | 9/2012 | Kato | ....................... | H03L 7/097 327/157 |
| 2016/0006443 A1* | 1/2016 | Lotfy | ................... | H03K 3/0315 331/34 |
| 2016/0118990 A1* | 4/2016 | Faisal | ................... | H03L 7/0997 327/156 |
| 2016/0211855 A1* | 7/2016 | Unruh | ...................... | H04B 1/40 |
| 2017/0170838 A1* | 6/2017 | Pagnanelli | ............ | H03F 3/2175 |

(Continued)

FOREIGN PATENT DOCUMENTS

| KR | 10-2007-0021426 A | 2/2007 |
|---|---|---|
| KR | 10-2015-0069493 A | 6/2015 |

(Continued)

*Primary Examiner* — Adam D Houston
(74) *Attorney, Agent, or Firm* — NSIP Law

(57) ABSTRACT

A sub-sampling phase-locked loop includes a first phase output unit sub-sampling an output clock of a digitally-controlled oscillator and outputting a sign bit corresponding to a voltage-domain phase and a second phase output unit outputting a gain bit corresponding to a time-domain phase based on a pulse width set according to the output clock and a threshold time set according to the reference clock.

16 Claims, 11 Drawing Sheets

(56) References Cited

U.S. PATENT DOCUMENTS

| | | | | |
|---|---|---|---|---|
| 2017/0187383 | A1* | 6/2017 | Lesso | H03L 7/099 |
| 2017/0346493 | A1* | 11/2017 | Markulic | H03L 7/197 |
| 2019/0020350 | A1* | 1/2019 | Shu | H03L 7/091 |
| 2019/0214976 | A1* | 7/2019 | Wu | H03K 5/1565 |
| 2020/0091922 | A1* | 3/2020 | Jany | H03L 7/06 |
| 2020/0195255 | A1* | 6/2020 | Fan | H03L 7/0895 |
| 2020/0195260 | A1* | 6/2020 | Sato | H03L 7/1976 |
| 2020/0373927 | A1* | 11/2020 | Liang | H03L 7/18 |
| 2021/0111724 | A1* | 4/2021 | Jung | H03L 7/0805 |

FOREIGN PATENT DOCUMENTS

| | | |
|---|---|---|
| KR | 10-2017-0069710 A | 6/2017 |
| KR | 10-2020-0045259 A | 5/2020 |

\* cited by examiner

DUAL-DOMAIN SUB-SAMPLING PHASE-LOCKED LOOP

CROSS-REFERENCE TO RELATED APPLICATION

This U.S. non-provisional patent application claims priority under 35 U.S.C. § 119 of Korean Patent Application No. 10-2020-0089201, filed on Jul. 17, 2020, the contents of which are hereby incorporated by reference in its entirety.

BACKGROUND

1. Field of Disclosure

The present disclosure relates to a dual-domain sub-sampling phase-locked loop.

2. Description of the Related Art

A phase-locked loop (PLL) is a circuit that generates a reference clock required for a wired transmission and reception and a digital circuit. The phase-locked loop PLL samples an external input reference clock having extremely low jitter and low speed to a phase of high speed clock of an oscillator, and thus, a clean and high speed clock of which speed is n-times greater than that of the reference clock is generated in an IC chip.

In particular, different from a conventional phase-locked loop, a sub-sampling phase-locked loop (SSPLL) does not use a frequency divider, and thus, a noise of a charge pump is not amplified by n-times. That is, the sub-sampling phase-locked loop SSPLL has an advantage in terms of noise.

In recent years, as the analog characteristics are degraded and become sensitive to the process-voltage-temperature (PVT) variation according to the scaling of the semiconductor process, a digital-based sub-sampling phase-locked loop has been spotlighted. As the digital-based sub-sampling phase-locked loop, there are a digital SSPLL using a bang-bang phase detector (PD) and a sub-sampling phase-locked loop SSPLL using an n-bit analog-to-digital converter (ADC).

However, since the jitter of the clock is large in the digital SSPLL using the bang-bang PD due to a high quantization noise, the digital SSPLL is not appropriate to provide the high speed clock. In addition, the SSPLL using the n-bit analog-to-digital converter has the disadvantage that requires a high performance analog-to-digital converter consuming a large amount of power.

Thus, a dual-domain sub-sampling phase locked-loop that enables the high quantization noise to be reduced and the power consumption to be decreased is provided.

SUMMARY

The present disclosure provides a dual-domain sub-sampling phase-locked loop capable of reducing a jitter in high-speed clock output through a phase-locked loop and reducing the number of circuits of the phase-locked loop.

Embodiments of the inventive concept provide a sub-sampling phase-locked loop including a first phase output unit sub-sampling an output clock of a digitally-controlled oscillator and outputting a sign bit corresponding to a voltage-domain phase and a second phase output unit outputting a gain bit corresponding to a time-domain phase based on a pulse width set according to the output clock and a threshold time set according to a reference clock.

Embodiments of the inventive concept provide a method of operating a sub-sampling phase-locked loop. The method includes allowing a first phase output unit to sub-sample an output clock of a digitally-controlled oscillator and to output a sign bit corresponding to a voltage-domain phase, allowing a second phase output unit to output a gain bit corresponding to a time-domain phase based on a threshold time set according to the reference clock and a pulse width set according to the output clock, and allowing a digital loop filter to calculate a digital loop filter value for controlling a phase of the output clock based on the sign bit and the gain bit.

According to the above, the dual-domain sub-sampling phase-locked loop is capable of outputting the voltage-domain phase and the time-domain phase, and thus, a jitter with respect to the output clock of the digitally-controlled oscillator is effectively reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
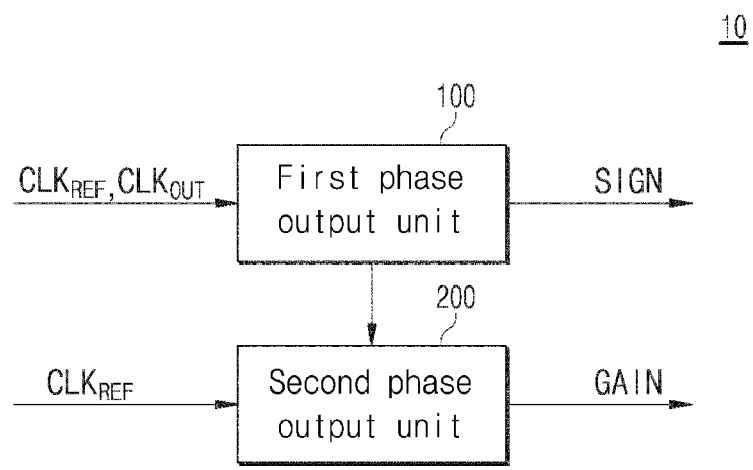
FIG. 1 is a block diagram showing a sub-sampling phase-locked loop according to an exemplary embodiment of the present disclosure.

Hereinafter, embodiments of the present disclosure will be described with reference to specific embodiments and the accompanying drawings. However, the embodiments of the present disclosure may be modified in various other forms, and the scope of the present disclosure is not limited to the embodiments described below. In addition, embodiments of the present disclosure are provided to more fully describe the present disclosure to those skilled in the art. Accordingly, the shape and size of elements in the drawings may be exaggerated for a clearer description, and elements indicated by the same reference numerals in the drawings are the same elements.

In addition, in order to clearly describe the present disclosure in the drawings, parts irrelevant to the description are omitted, and thicknesses are enlarged to clearly express various layers and regions, and components having the same function within the scope of the same idea have the same reference. Further, throughout the specification, when a part "includes" a certain component, it means that the component may further include other components, not to exclude other components, unless otherwise stated.

Figure 2A:
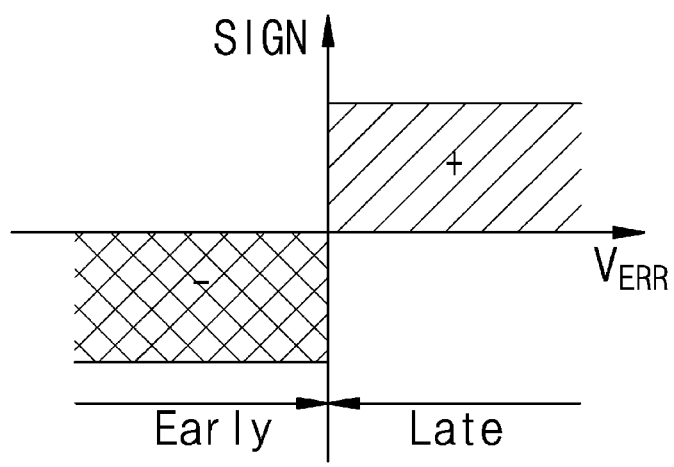
FIG. 2A is a view showing a sign bit of FIG. 1.
Figure 2B:
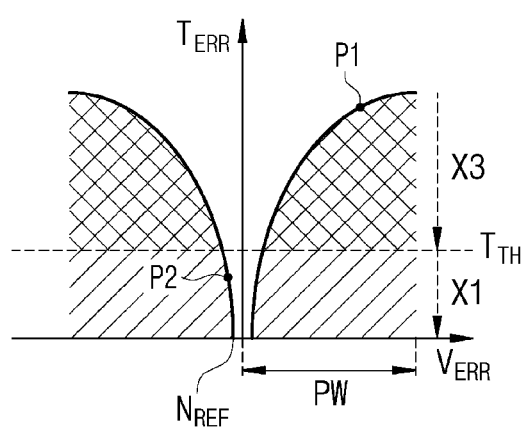
FIG. 2B is a view showing a gain bit of FIG. 1.

FIG. 1 is a block diagram showing a sub-sampling phase-locked loop 10 according to an exemplary embodiment of the present disclosure, FIG. 2A is a view showing a sign bit SIGN of FIG. 1, and FIG. 2B is a view showing a gain bit GAIN of FIG. 1.

Referring to FIGS. 1, 2A, and 2B, the sub-sampling phase-locked loop 10 may include first and second phase output units 100 and 200.

The first phase output unit 100 may output the sign bit SIGN corresponding to a voltage-domain phase based on an output clock $CLK_{OUT}$ of a digitally-controlled oscillator (DCO).

In detail, the first phase output unit 100 may sub-sample the output clock $CLK_{OUT}$ output from the digitally-controlled oscillator DCO with a reference clock $CLK_{REF}$ and may output the sign bit SIGN corresponding to the voltage-domain phase.

In the present disclosure, a sampling operation may correspond to an operation of detecting target information, and the sub-sampling operation may correspond to an operation of detecting the sign bit SIGN from the output clock $CLK_{OUT}$.

In the present embodiment, the sign bit SIGN may have any one of positive (+) and negative (−) values according to a voltage error $V_{ERR}$ at which the output clock $CLK_{OUT}$ is sampled as shown in FIG. 2A. For example, in a case where the voltage error $V_{ERR}$ is in an early state, the first phase output unit 100 may output the sign bit SIGN having the negative (−) value. In addition, in a case where the voltage error $V_{ERR}$ of the output clock $CLK_{OUT}$ is in a late state, the first phase output unit 100 may output the sign bit SIGN having the positive (+) value.

Then, the second phase output unit 200 may output the gain bit GAIN corresponding to a time-domain phase based on a pulse width PW set according to the output clock $CLK_{OUT}$ and a threshold time $T_{TH}$ set according to the reference clock $CLK_{REF}$.

In detail, the second phase output unit 200 may set the threshold time $T_{TH}$ with respect to the gain bit GAIN according to the reference clock $CLK_{REF}$. In addition, the second phase output unit 200 may set the pulse width PW with respect to the gain bit GAIN according to the output clock $CLK_{OUT}$ that is sub-sampled by the first phase output unit 100.

In this case, the second phase output unit 200 may output the gain bit GAIN corresponding to the time-domain phase based on the threshold time $T_{TH}$ and the pulse width PW.

As shown in FIG. 2B, the gain bit GAIN may have a value that is changed to be symmetric with respect to a reference point NREF according to a time error $T_{ERR}$ at which the output clock $CLK_{OUT}$ is sampled.

For example, in a case where the time error $T_{ERR}$ corresponds to a first point P1, the second phase output unit 200 may output the gain bit GAIN corresponding to an "X3". In addition, in a case where the time error $T_{ERR}$ corresponds to a second point P2, the second phase output unit 200 may output the gain bit GAIN corresponding to an "X1".

A value obtained by multiplying the sign bit SIGN by the gain bit GAIN according to the embodiment may correspond to an input value of a digital loop filter. In this case, the digital loop filter value may be a control signal to control the digitally-controlled oscillator DCO.

The sub-sampling phase-locked loop 10 according to an embodiment of the present disclosure may output the sign bit SIGN corresponding to the voltage-domain phase and the gain bit GAIN corresponding to the time-domain phase via the first and second phase output units 100 and 200 for the digital loop filter value, and thus, when compared with a jitter of an output clock based on a conventional voltage domain phase, a jitter of the output clock $CLK_{OUT}$ may be further reduced.

Figure 3:
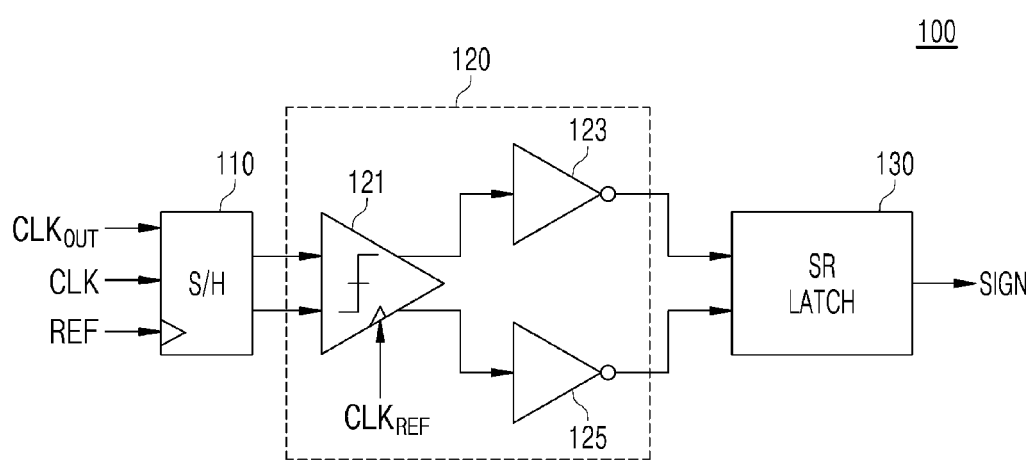
FIG. 3 is a view showing a first phase output unit of FIG. 1.

FIG. 3 is a view showing the first phase output unit 100 of FIG. 1.

Referring to FIGS. 1 and 3, the first phase output unit 100 may include a sample-and-holder 110, a signal sampler 120, and an SR latch 130.

The sample-and-holder 110 may sample a first differential input voltage from the output clock $CLK_{OUT}$ in response to the reference clock $CLK_{REF}$. For example, the sample-and-holder 110 may detect the first differential input voltage from the output clock $CLK_{OUT}$.

Then, the signal sampler 120 may sample a latch input signal from the first differential input voltage in response to the reference clock $CLK_{REF}$.

The signal sampler 120 may include a first comparator 121 and a pair of inverters 123 and 125. In detail, the first comparator 121 may compare the first differential input voltage in response to the reference clock $CLK_{REF}$ and may output a pair of comparison signals based on the compared result. The, the pair of inverts 123 and 125 may invert the pair of comparison signals to latch input signals, respectively, and may output the latch input signals to the SR latch 130.

Then, the SR latch 130 may output the sign bit SIGN based on the latch input signals provided from the signal sampler 120.

That is, the first phase output unit 100 may perform the sub-sampling operation that detects the sign bit SIGN from the output clock $CLK_{OUT}$ using the sample-and-holder 110, the signal sampler 120, and the SR latch 130.

Figure 4:
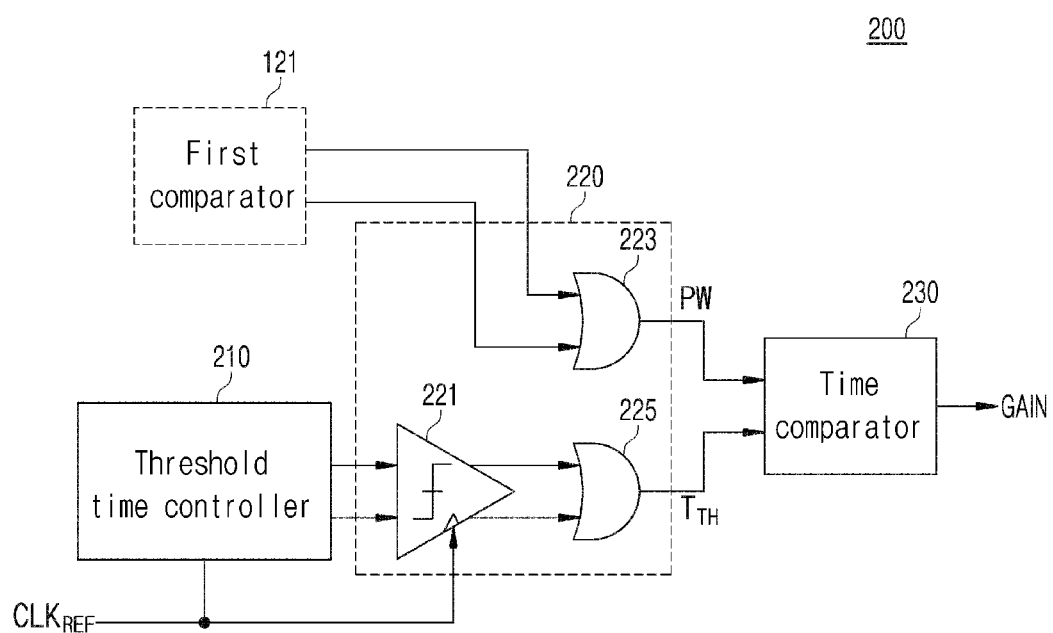
FIG. 4 is a view showing a second phase output unit of FIG. 1.

FIG. 4 is a view showing the second phase output unit 200 of FIG. 1.

Referring to FIGS. 1, 3, and 4, the second phase output unit 200 may include a threshold time controller 210, a signal setting unit 220, and a time comparator 230.

The threshold time controller 210 may output a second differential input voltage to set the threshold time $T_{TH}$ based on the reference clock $CLK_{REF}$ and the gain bit GAIN.

Then, the signal setting unit 220 may set the threshold time $T_{TH}$ and the pulse width PW based on the first and second differential input voltages and the reference clock $CLK_{REF}$.

The signal setting unit 220 may include a second comparator 221 and first and second OR gates 223 and 225. In detail, the second comparator 221 may compare the second differential input voltage in response to the reference clock $CLK_{REF}$ and may output a pair of second comparison signals based on the compared result.

In this case, the first OR gate 223 may perform an OR operation on a pair of first comparison signals applied thereto from the first comparator 121 to output the pulse width PW with respect to the gain bit GAIN to the time comparator 230. In addition, the second OR gate 225 may perform an OR operation on a pair of second comparison signals applied thereto from the second comparator 221 to output the threshold time $T_{TH}$ with respect to the gain bit GAIN to the time comparator 230.

Then, the time comparator 230 may compare the pulse width PW and the threshold time $T_{TH}$, which are applied thereto from the first and second OR gates 223 and 225 and may output the gain bit GAIN based on the compared result. When compared with a voltage-domain-based comparator used in a conventional sub-sampling phase detector, the time comparator 230 described above may consume less power.

Figure 5:
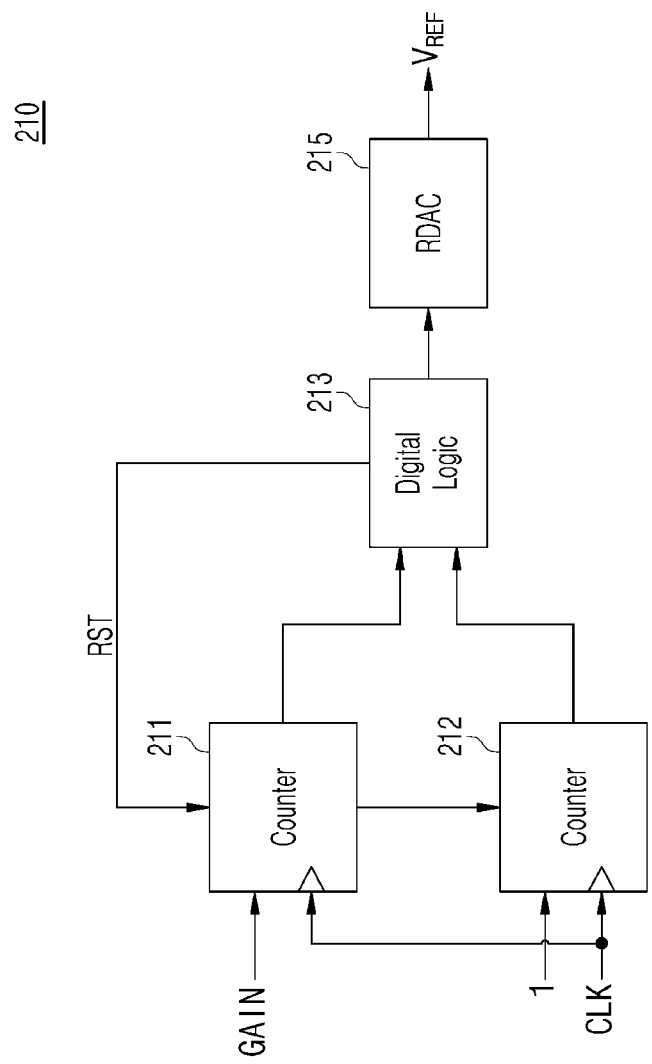
FIG. 5 is a view showing a threshold time controller of FIG. 4.

FIG. 5 is a view showing the threshold time controller 210 of FIG. 4.

Referring to FIGS. 4 and 5, the threshold time controller 210 may include first and second digital counters 211 and 212, a digital logic 213, and a converter 215.

The first digital counter 211 may count the number of bits of the gain bit GAIN in response to the reference clock $CLK_{REF}$, and the second digital counter 212 may count the number of cycles of the reference clock $CLK_{REF}$. In the present embodiment, the first and second digital counters 211 and 212 may be formed as 7-bit counters.

Then, the digital logic 213 may output a digital logic value to generate the second differential input voltage based on a pair of counting values output by the first and second digital counters 211 and 212.

According to an embodiment, the digital logic 213 may output a reset signal to reset the first digital counter 211 based on the number of cycles of the reference clock $CLK_{REF}$, which is counted by the second digital counter 212. That is, in a case where the number of cycles of the reference clock $CLK_{REF}$ corresponds to a predetermined number of times, the digital logic 213 may output the reset signal to the first digital counter 211.

For example, the digital logic 213 may reset the first digital counter 211 whenever the number of cycles of the reference clock $CLK_{REF}$ is counted 100 times by the second digital counter 212 to find an optimal threshold time.

Then, the converter 215 may covert the digital logic value provided thereto from the digital logic 213 to the second differential input voltage. In this case, the converter 215 may be, but not limited to, a resistive digital-to-analog converter (RDAC).

Figure 6:
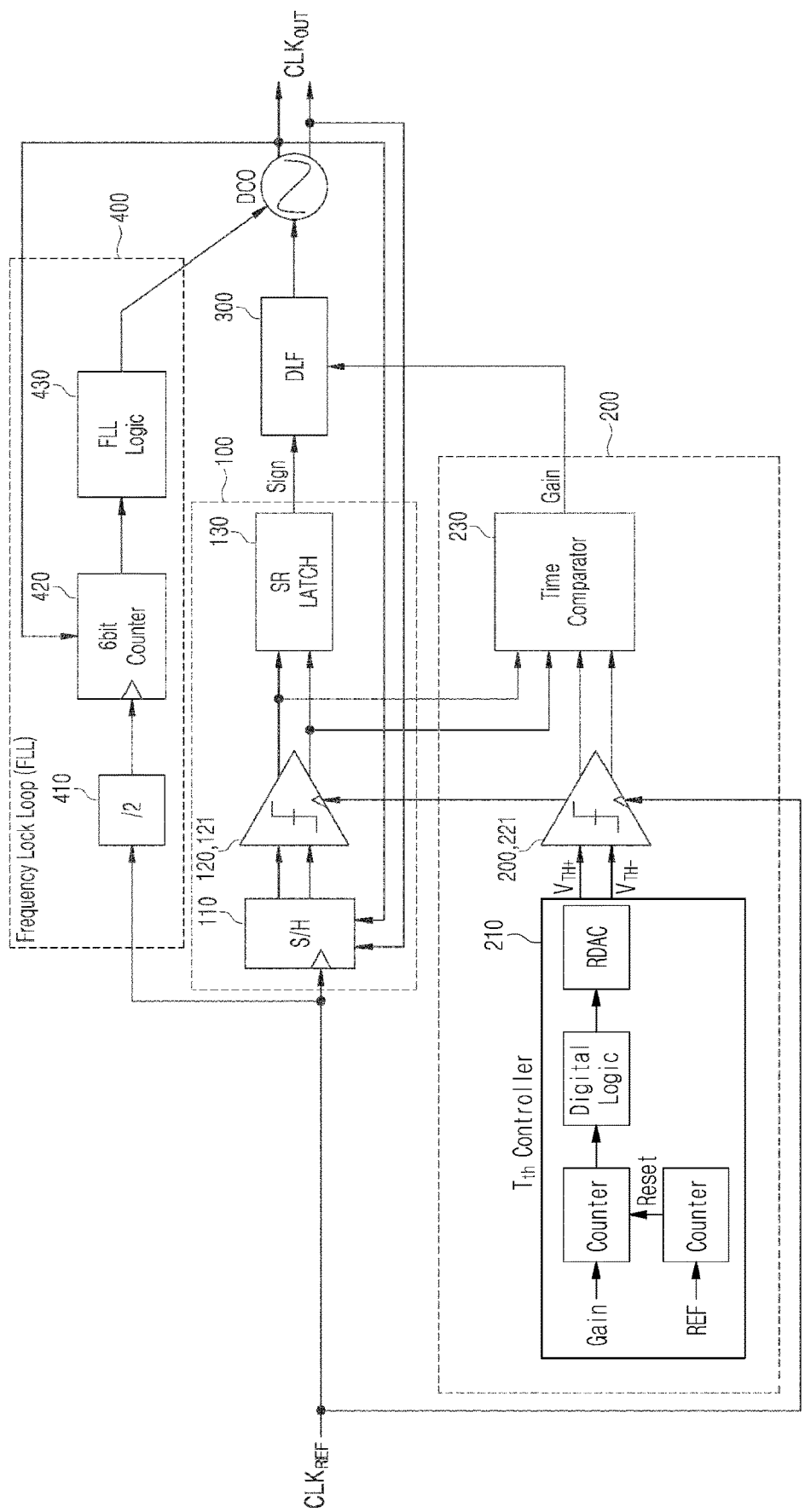
FIG. 6 is a view showing an embodiment of the sub-sampling phase-locked loop of FIG. 1.

FIG. 6 is a view showing an embodiment of a sub-sampling phase-locked loop 11 of FIG. 1.

Referring to FIGS. 1 to 6, the sub-sampling phase-locked loop 11 may include first and second phase output units 100 and 200, a digital loop filter 300, and a frequency-locked loop 400. Hereinafter, repetitive descriptions of the first and second phase output units 100 and 200 assigned with the same reference numerals as those described in FIGS. 1 to 4 will be omitted.

The digital loop filter 300 may calculate the digital loop filter value based on the gain bit GAIN and the sign bit SIGN.

In detail, the digital loop filter 300 may receive the sing bit SIGN from the first phase output unit 100 and may receive the gain bit GAIN from the second phase output unit 200. Then, digital loop filter 300 may calculate the digital loop filter value based on the gain bit GAIN and the sign bit SIGN and may output the calculated digital loop filer value to the digitally-controlled oscillator DCO.

In this case, the digitally-controlled oscillator DCO may control a phase of the output clock $CLK_{OUT}$ based on the digital loop filter value provided thereto from the digital loop filter 300.

Then, the frequency-locked loop 400 may output an FLL logic value to the digitally-controlled oscillator DCO based on the reference clock $CLK_{REF}$ and the output clock $CLK_{OUT}$ to lock a frequency of the output clock $CLK_{OUT}$. Accordingly, it is possible to solve a problem of narrowing a detection range for the gain bit GAIN and the sign bit SIGN in the phase-locked loop performing the sub-sampling.

In detail, the frequency-locked loop 400 may include a frequency divider 410, a locked loop counter 420, and a locked loop logic 430.

In the present embodiment, the frequency divider 410 may divide the frequency of the reference clock $CLK_{REF}$ by a certain ratio. For example, the certain ratio may be about 1/2.

In this case, the locked loop counter 420 may count the output clock $CLK_{OUT}$ in response to the reference clock $CLK_{REF}$ divided by the frequency divider 410. The locked loop counter 420 may be a 6-bit counter.

After that, the locked loop logic 430 may control the digitally-controlled oscillator DCO based on the counted value of the output clock $CLK_{OUT}$, which is counted by the locked loop counter 420, to lock the frequency of the output clock $CLK_{OUT}$.

Meanwhile, the signal sampler 120 and the signal setting unit 220 are shown as the first comparator 121 and the second comparator 221 to help understand the drawings, however, they should not be limited thereto or thereby. The signal sampler 120 may further include the pair of inverters 123 and 125, and the signal setting unit 220 may further include the first and second OR gates 223 and 225.

As shown in FIG. 6, in the sub-sampling phase-locked loop 11, the number of the first and second comparators 121 and 221 used to compare the first and second differential input voltages is smaller than that of the conventional sub-sampling phase detector, and thus, the sub-sampling phase-locked loop 11 may consume less power compared with the conventional sub-sampling phase detector that uses a larger number of comparators.

Figure 7:
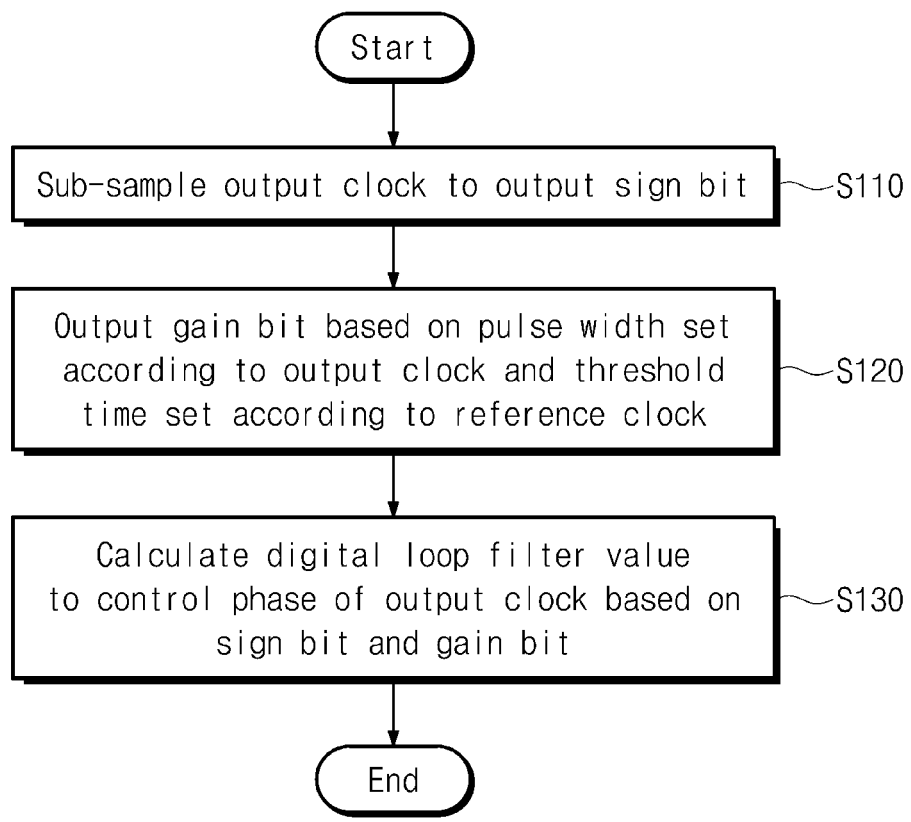
FIG. 7 is a flowchart showing an operation of the sub-sampling phase-locked loop of FIG. 5.

FIG. 7 is a flowchart showing an operation of the sub-sampling phase-locked loop 11 of FIG. 6.

Referring to FIGS. 6 and 7, the first phase output unit 100 may sub-sample the output clock $CLK_{OUT}$ of the digitally-controlled oscillator DCO and may output the sign bit SIGN corresponding to the voltage-domain phase (S110).

The second phase output unit 200 may output the gain bit GAIN corresponding to the time-domain phase based on the threshold time set according to the output clock $CLK_{OUT}$ and the pulse width set according to the reference clock $CLK_{REF}$ (S120).

Then, the digital loop filter 300 may calculate the digital loop filter value based on the sign bit SIGN and the gain bit GAIN to control the phase of the output clock $CLK_{OUT}$ (S130).

The frequency-locked loop 400 may output the FLL logic value to the digitally-controlled oscillator DCO based on the reference clock $CLK_{REF}$ and the output clock $CLK_{OUT}$ to lock the frequency of the output clock $CLK_{OUT}$ (S130).

Figure 8:
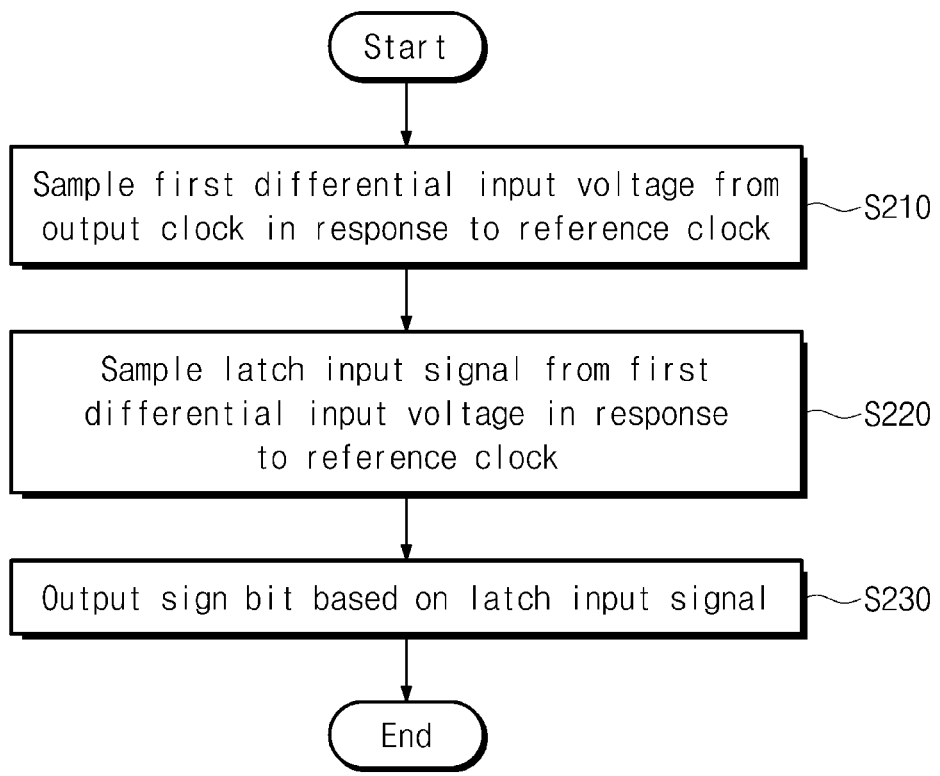
FIG. 8 is a flowchart showing an operation of the first phase output unit of FIG. 3.

FIG. 8 is a flowchart showing an operation of the first phase output unit 100 of FIG. 3.

Referring to FIGS. 3 and 8, the sample-and-holder 110 may sample the first differential input voltage from the output clock $CLK_{OUT}$ in response to the reference clock $CLK_{REF}$ (S210).

Then, the signal sampler 120 may sample the latch input signal from the first differential input voltage in response to the reference clock $CLK_{REF}$ (S220).

The SR latch 130 may output the sign bit SIGN based on the latch input signal applied thereto from the signal sampler 120 (S230).

Figure 9:
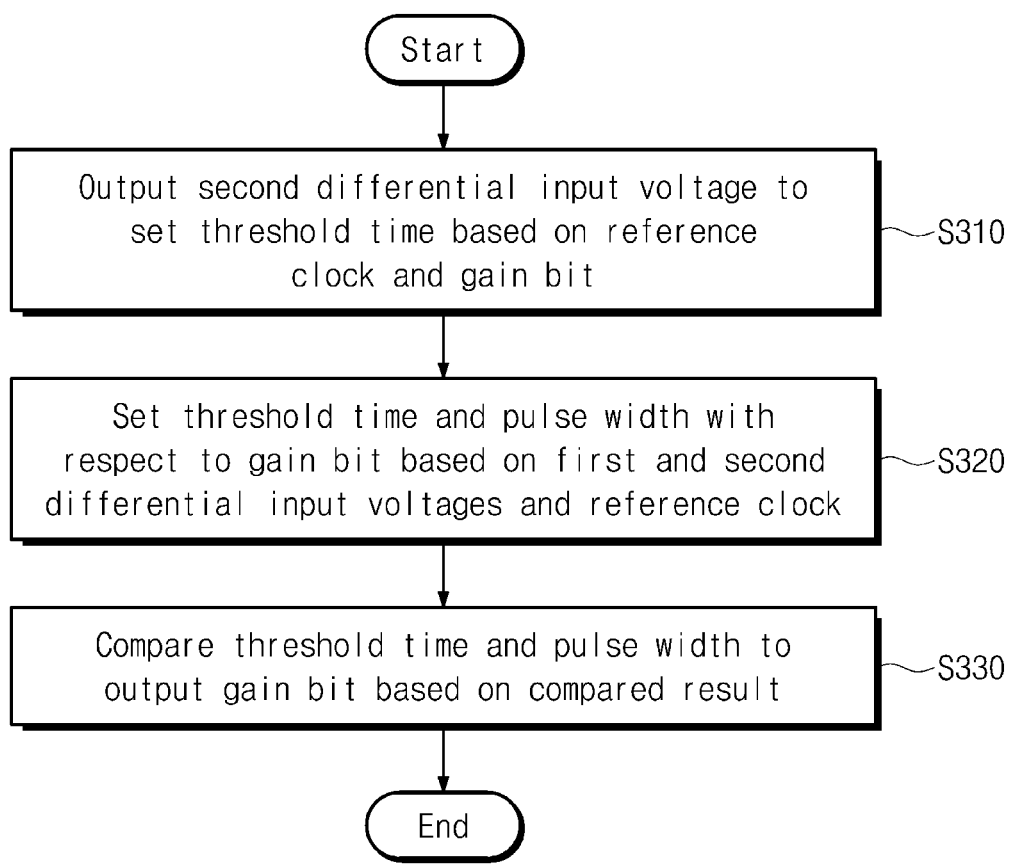
FIG. 9 is a flowchart showing an operation of the second phase output unit of FIG. 4.

FIG. 9 is a flowchart showing an operation of the second phase output unit 200 of FIG. 4.

Referring to FIGS. 4 and 9, the threshold time controller 210 may output the second differential input voltage based on the reference clock $CLK_{REF}$ and the gain bit GAIN to set the threshold time $T_{TH}$ (S310).

Then, the signal setting unit 220 may set the threshold time $T_{TH}$ and the pulse width PW with respect to the gain bit GAIN based on the first and second differential input voltages and the reference clock $CLK_{REF}$ (S320).

The time comparator 230 may compare the threshold time $T_{TH}$ with the pulse width PW and may output the gain bit GAIN based on the compared result (S330).

Figure 10:
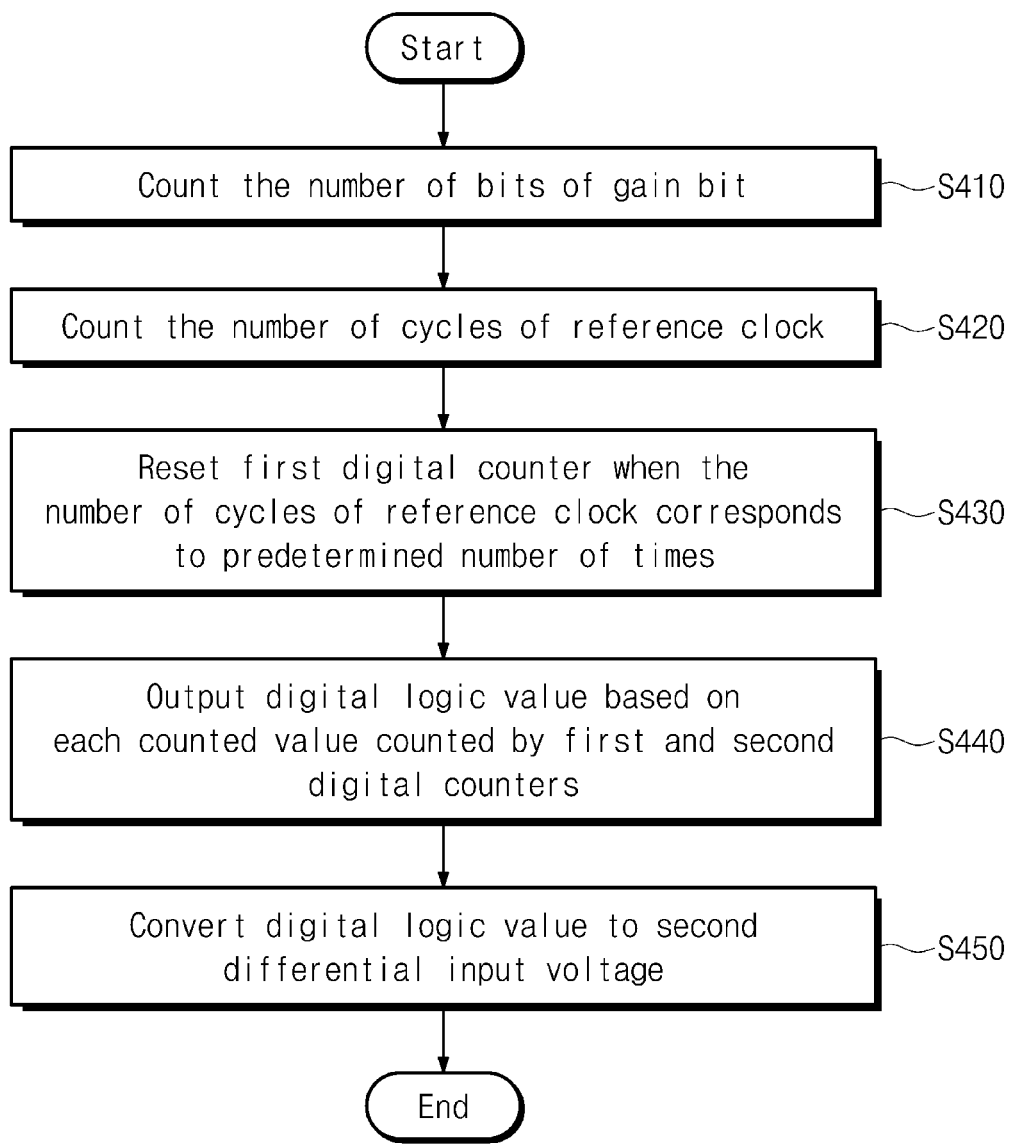
FIG. 10 is a flowchart showing an operation of the threshold time controller of FIG. 5.

FIG. 10 is a flowchart showing an operation of the threshold time controller 210 of FIG. 5

Referring to FIGS. 4, 5, and 10, the first digital counter 211 may count the number of bits of the gain bit GAIN (S410).

In addition, the second digital counter 212 may count the number of cycles of the reference clock $CLK_{REF}$ (S420).

When the number of cycles of the reference clock $CLK_{REF}$, which is counted by the second digital counter 212, corresponds to the predetermined number of times, the digital logic 213 may reset the first digital counter 211 (S430).

The digital logic 213 may output the digital logic value to generate the second differential input voltage based on the counted value counted by the first and second digital counters 211 and 212 (S440).

Then, the converter 215 may convert the digital logic value to the second differential input voltage (S450).

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A sub-sampling phase-locked loop comprising:
   a first phase output unit sub-sampling an output clock of a digitally-controlled oscillator and outputting a sign bit corresponding to a voltage-domain phase;
   a second phase output unit outputting a gain bit corresponding to a time-domain phase based on a pulse width set according to the output clock and a threshold time set according to a reference clock; and
   a digital loop filter calculating a digital loop filter value based on the sign bit and the gain bit,
   wherein a value obtained by multiplying the sign bit by the gain bit corresponds to an input value of the digital loop filter value to control a phase of the output clock.

2. The sub-sampling phase-locked loop of claim 1, wherein the first phase output unit comprises:
   a sample-and-holder sampling a first differential input voltage from the output clock in response to the reference clock;
   a signal sampler sampling a latch input signal from the first differential input voltage in response to the reference clock; and
   an SR latch outputting the sign bit in response to the latch input signal.

3. The sub-sampling phase-locked loop of claim 2, wherein the signal sampler comprises:

a first comparator comparing the first differential input voltage in response to the reference clock and outputting a pair of first comparison signals based on the compared result; and
   a pair of inverters inverting the pair of first comparison signals.

4. The sub-sampling phase-locked loop of claim 2, wherein the second phase output unit comprises:
   a threshold time controller outputting a second differential input voltage based on the reference clock and the gain bit to set the threshold time;
   a signal setting unit setting the threshold time and the pulse width based on the reference clock and the first and second differential input voltages; and
   a time comparator comparing the threshold time with the pulse width and outputting the gain bit based on the compared result.

5. The sub-sampling phase-locked loop of claim 4, wherein the signal setting unit comprises:
   a second comparator comparing the second differential input voltage in response to the reference clock and outputting a pair of second comparison signals based on the compared result;
   a first OR gate performing an OR operation on the pair of first comparison signals and outputting the pulse width; and
   a second OR gate performing an OR operation on the pair of second comparison signals and outputting the threshold time.

6. The sub-sampling phase-locked loop of claim 4, wherein the threshold time controller comprises:
   a first digital counter counting a number of bits of the gain bit;
   a second digital counter counting a number of cycles of the reference clock;
   a digital logic outputting a digital logic value based on a pair of counted values output from the first and second digital counters to generate the second differential input voltage; and
   a converter converting the digital logic value to the second differential input voltage.

7. The sub-sampling phase-locked loop of claim 6, wherein the converter is a resistive digital-to-analog converter.

8. The sub-sampling phase-locked loop of claim 6, wherein the digital logic resets the first and second digital counters based on the number of cycles of the reference clock.

9. The sub-sampling phase-locked loop of claim 1, further comprising:
   a frequency-locked loop (FLL) outputting an FLL logic value to the digitally-controlled oscillator to lock a frequency of the output clock based on the output clock and the reference clock.

10. The sub-sampling phase-locked loop of claim 9, wherein the digitally-controller oscillator controls a phase of the output clock based on the digital loop filter value.

11. The sub-sampling phase-locked loop of claim 9, wherein the frequency-locked loop comprises:
    a frequency divider dividing a frequency of the reference clock by a certain ratio;
    a loop counter counting the output clock in response to the reference clock divided by the frequency divider; and
    a locked loop logic locking the frequency of the output clock based on the counted value counted by the loop counter.

12. A method of operating a sub-sampling phase-locked loop, the method comprising:
- allowing a first phase output unit to sub-sample an output clock of a digitally-controlled oscillator and to output a sign bit corresponding to a voltage-domain phase;
- allowing a second phase output unit to output a gain bit corresponding to a time-domain phase based on a threshold time set according to the reference clock and a pulse width set according to the output clock; and
- allowing a digital loop filter to calculate a digital loop filter value for controlling a phase of the output clock based on the sign bit and the gain bit,
- wherein an input value of the digital loon filter value corresponds to a value obtained by multiplying the sign bit by the gain bit.

13. The method of claim 12, wherein the outputting of the sign bit comprises:
- allowing a sample-and-holder to receive the output clock and to sample a first differential input voltage;
- allowing a signal sampler to sample a latch input signal from the first differential input voltage in response to the reference clock; and
- allowing an SR latch to output the sign bit based on the latch input signal.

14. The method of claim 12, wherein the outputting of the gain bit comprises:
- allowing a threshold time controller to output a second differential input voltage in response to the reference clock to set the threshold time;
- allowing a signal setting unit to output the threshold time and the pulse width based on the first and second differential input voltages and the reference clock; and
- allowing a time comparator to compare the threshold time with the pulse width and to output the gain bit based on the compared result.

15. The method of claim 14, wherein the outputting of the second differential input voltage comprises:
- allowing a first digital counter to count a number of bits of the gain bit;
- allowing a digital logic to output a digital logic value based on a pair of counted values output from first and second digital counters to generate the second differential input voltage; and
- allowing a converter to convert the digital logic value to the second differential input voltage.

16. The method of claim 12, further comprising allowing a frequency-locked loop to output an FLL logic value to the digitally-controlled oscillator based on the output clock and the reference clock to lock a frequency of the output clock.

\* \* \* \* \*